US010894799B2

(12) United States Patent
Kim et al.

(10) Patent No.: US 10,894,799 B2
(45) Date of Patent: Jan. 19, 2021

(54) COMPOSITION FOR DEPOSITING SILICON-CONTAINING THIN FILM INCLUDING DISILYLAMINE COMPOUND AND METHOD FOR MANUFACTURING SILICON-CONTAINING THIN FILM USING THE SAME

(71) Applicant: DNF CO., LTD, Daejeon (KR)

(72) Inventors: Sung Gi Kim, Daejeon (KR); Se Jin Jang, Jeju-si (KR); Byeong-il Yang, Daejeon (KR); Joong Jin Park, Daejeon (KR); Sang-Do Lee, Daejeon (KR); Jeong Joo Park, Daejeon (KR); Sam Dong Lee, Daejeon (KR); Gun-Joo Park, Daejeon (KR); Sang Ick Lee, Daejeon (KR); Myong Woon Kim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 0 days.

(21) Appl. No.: 16/606,728

(22) PCT Filed: Apr. 19, 2018

(86) PCT No.: PCT/KR2018/004561
§ 371 (c)(1),
(2) Date: Oct. 18, 2019

(87) PCT Pub. No.: WO2018/194396
PCT Pub. Date: Oct. 25, 2018

(65) Prior Publication Data
US 2020/0131205 A1 Apr. 30, 2020

(30) Foreign Application Priority Data
Apr. 20, 2017 (KR) .................. 10-2017-0051101
Apr. 18, 2018 (KR) .................. 10-2018-0045084

(51) Int. Cl.
C07F 7/02 (2006.01)
C07F 7/10 (2006.01)
H01L 21/02 (2006.01)
C23C 16/455 (2006.01)
C23C 16/24 (2006.01)

(52) U.S. Cl.
CPC .............. C07F 7/10 (2013.01); C23C 16/24 (2013.01); C23C 16/45536 (2013.01); H01L 21/02208 (2013.01); H01L 21/02271 (2013.01); H01L 21/0228 (2013.01); H01L 21/02274 (2013.01)

(58) Field of Classification Search
None
See application file for complete search history.

(56) References Cited

U.S. PATENT DOCUMENTS

| 7,482,286 B2* | 1/2009 | Misra ................ H01L 21/02189 438/778 |
| 9,969,756 B2* | 5/2018 | Fafard .................... C23C 16/345 |
| 2002/0016084 A1 | 2/2002 | Todd | |
| 2015/0094470 A1* | 4/2015 | Sanchez ............ H01L 21/02617 546/14 |
| 2015/0376211 A1* | 12/2015 | Girard .................. C23C 16/345 428/447 |
| 2016/0365244 A1 | 12/2016 | Chandra et al. | |
| 2018/0087150 A1* | 3/2018 | Kerrigan ........... C23C 16/45553 |

FOREIGN PATENT DOCUMENTS

| JP | 2010066597 A | 3/2010 |
| KR | 20140133597 A | 11/2014 |

OTHER PUBLICATIONS

Stüger, H. et al., "Aminochlorodisilanes: precursors to multifunctionalized disilane derivatives," Journal of Organometallic Chemistry, vol. 547, No. 1, Dec. 1, 1997, 7 pages.

Gollner, W. et al., "Linear and Cyclic Polysilanes Containing the Bis(trimethylsilyl)amino Group: Synthesis, Reactions, and Spectroscopic Characterization," Inorganic Chemistry, vol. 42, No. 15, Jul. 28, 2003, 6 pages.

ISA Korean Intellectual Property Office, International Search Report Issued in Application No. PCT/KR2018/004561, dated Jul. 26, 2018, WIPO, 6 pages.

* cited by examiner

Primary Examiner — Ali Naraghi
(74) Attorney, Agent, or Firm — McCoy Russell LLP

(57) ABSTRACT

Provided are a novel disilylamine compound, a method for preparing same, and a composition for depositing a silicon-containing thin film including the same. A disilylamine compound of the present invention has excellent reactivity, is thermally stable, and has high volatility, and thus, is used as a silicon-containing precursor, thereby manufacturing a high-quality silicon-containing thin film.

13 Claims, 1 Drawing Sheet

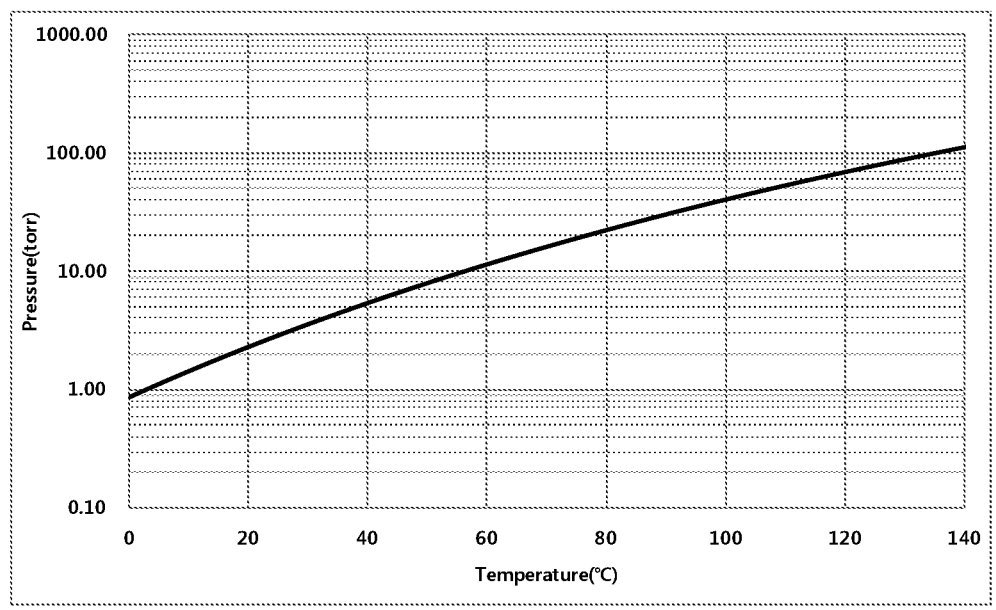

COMPOSITION FOR DEPOSITING SILICON-CONTAINING THIN FILM INCLUDING DISILYLAMINE COMPOUND AND METHOD FOR MANUFACTURING SILICON-CONTAINING THIN FILM USING THE SAME

CROSS-REFERENCE TO RELATED APPLICATIONS

The present application is a U.S. National Phase of International Patent Application Serial No. PCT/KR2018/004561 entitled "SILICON-CONTAINING THIN FILM DEPOSITION COMPOSITION COMPRISING DISILYLAMINE COMPOUND AND METHOD FOR PREPARING SILICON-CONTAINING THIN FILM BY MEANS OF SAME," filed on Apr. 19, 2018. International Patent Application Serial No. PCT/KR2018/004561 claims priority to Korean Patent Application No. 10-2017-0051101 filed on Apr. 20, 2017 and Korean Patent Application No. 10-2018-0045084 filed on Apr. 18, 2018. The entire contents of each of the above-referenced applications are hereby incorporated by reference for all purposes.

TECHNICAL FIELD

The following disclosure relates to a composition for depositing a silicon-containing thin film including a disilylamine compound, and a method for manufacturing a silicon-containing thin film using the same.

BACKGROUND

A silicon-containing thin film is manufactured in various forms of thin films such as a silicon film, a silicon oxide film, a silicon nitride film, a silicon carbonitride film, a silicon oxynitride film, and the like, by various deposition processes in a semiconductor field, and is variously applied to many fields. In particular, the silicon oxide film and the silicon nitride film have very good barrier properties and oxidation resistance, so that they are used as an insulating film, a diffusion preventing film, a hard mask, an etch stop layer, a seed layer, a spacer, a trench isolation, an intermetallic dielectric material, and a protective film layer in the manufacture of a device. Recently, a polycrystalline silicon thin film is used in a thin film transistor (TFT), a solar battery and the like, and the application fields thereof are becoming increasingly diverse.

As a representative technology known for manufacturing a silicon-containing thin film, there are metal organic chemical vapor deposition (MOCVD) forming a film on a surface of a substrate by reacting a silicon precursor in a mixed gas form and a reaction gas, or forming a film by direct reaction on a surface of a substrate, and atomic layer deposition (ALD) forming a film by physical or chemical adsorption of a silicon precursor in a gas form on a surface of a substrate, followed by sequential introduction of a reaction gas. In addition, various technologies for manufacturing a thin film such as low pressure chemical vapor deposition (LPCVD), plasma enhanced chemical vapor deposition (PECVD), plasma enhanced atomic layer deposition (PEALD) using plasma capable of being deposited at a low temperature, and the like, are applied to a next-generation semiconductor and a display device manufacturing process, thereby being used to form ultra-fine patterns and deposit ultra-thin film having uniform and excellent properties at a nano-sized thickness.

As a representative precursor used for forming a silicon-containing thin film, compounds in the form of silane, silane chlorides, aminosilane and alkoxysilane may be listed, and the characteristics of the precursor which are commonly required are as follows:

Compounds in a liquid form at room temperature under normal pressure, and compounds having excellent volatility;

Compounds having their own high thermal stability and low activation energy to have excellent reactivity;

Compounds not producing a non-volatile by-product in the process of thin film formation; and Compounds being easy to handle, transport and store.

Currently, studies on silicon-containing thin film deposition using a compound in the form of silane chlorides such as dichlorosilane ($SiH_2Cl_2$) and hexachlorodisilane ($Cl_3SiSiCl_3$) and an aminosilane compound such as trisilylamine ($N(SiH_3)_3$), bis-diethylaminosilane ($H_2Si(N(CH_2CH_3)_2)_2$) and di-isopropylaminosilane ($H_3SiN(i-C_3H_7)_2$), and the like have been reported in various documents, and the precursor is used in a mass production of a semiconductor and a display. However, according to miniaturization of devices caused by ultra-high integration of the devices, an increase in an aspect ratio, and diversification of device material, a technology of forming an ultra-fine thin film having a uniform and thin thickness and excellent electrical properties at a desired low temperature has been demanded, and thus, a high temperature process at 600° C. or more, step coverage, etching property, and physical and electrical properties of a thin film at the time of using the existing silicon precursor are emerging as an issue.

However, even in the case of forming an ultrafine thin film having a uniform and thin thickness at low temperature required in the device and excellent electrical properties, productivity is problematic due to a low thin film formation speed, and thus, development of a novel silicon precursor having improved performance is required.

RELATED ART DOCUMENT

Patent Document

U.S. Patent Application Publication No. 2016-0365244

SUMMARY

An embodiment of the present invention is directed to providing a composition for depositing a silicon-containing thin film including a disilylamine compound having high thermal stability and excellent reactivity, thereby having excellent cohesion at low temperature, as a silicon precursor.

Further, an embodiment of the present invention is directed to providing a method for manufacturing a silicon-containing thin film, capable of forming a silicon-containing thin film having excellent physical and electrical properties such as a high deposition rate, an excellent step coverage, and the like, using the composition for depositing a silicon-containing thin film according to an exemplary embodiment of the present invention.

In one general aspect, a composition for depositing a silicon-containing thin film includes a disilylamine compound having low activation energy to have excellent reactivity, being thermally stable and having excellent volatility, thereby being very useful as a precursor for depositing a thin film, and the disilylamine compound included in the composition for depositing a silicon-containing thin film of the present invention is represented by the following Chemical Formula 1:

[Chemical Formula 1]

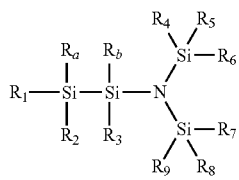

wherein $R_a$, $R_b$ and $R_1$ to $R_9$ are each independently hydrogen, $(C_1-C_7)$alkyl or $(C_2-C_7)$alkenyl, with a proviso that $R_a$ and $R_b$ are not hydrogen at the same time.

Preferably, in Chemical Formula 1 according to an exemplary embodiment of the present invention, $R_a$ and $R_b$ may be each independently hydrogen, (C1-C5)alkyl or (C2-C5) alkenyl, with a proviso that $R_a$ and $R_b$ are not hydrogen at the same time; $R_1$ to $R_3$ may be hydrogen; and $R_4$ to $R_9$ may be each independently hydrogen, (C1-C5)alkyl or (C2-C5) alkenyl.

Preferably, Chemical Formula 1 of the present invention may be represented by the following Chemical Formula 2:

[Chemical Formula 2]

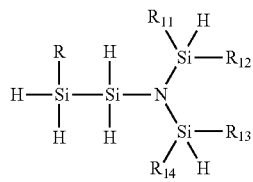

wherein R is (C1-C7)alkyl; and $R_{11}$ to $R_{14}$ are each independently hydrogen, (C1-C7)alkyl or (C2-C7)alkenyl.

In terms of depositing a thin film having better purity and durability, preferably in Chemical Formula 2 according to an exemplary embodiment of the present invention, $R_{11}$ to $R_{14}$ may be each independently hydrogen or (C1-C5)alkyl.

Specifically, the disilylamine compound of Chemical Formula 1 of the present invention may be selected from the following compounds, but not limited thereto:

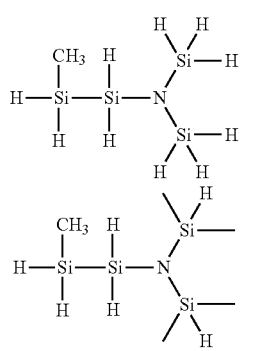
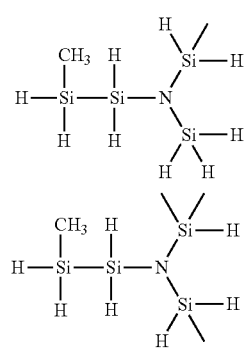
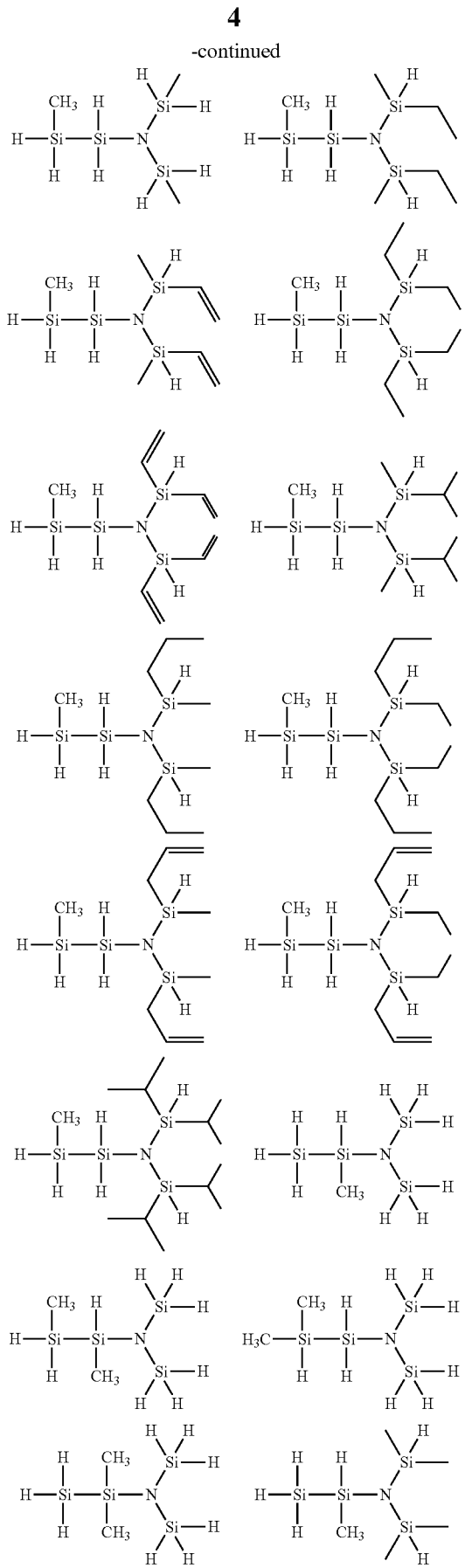

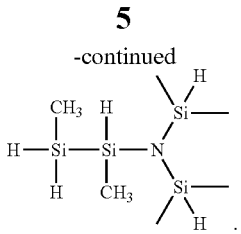

In another general aspect, a method for manufacturing a silicon-containing thin film uses the composition for depositing a silicon-containing thin film of the present invention.

The method for manufacturing a silicon-containing thin film of the present invention may be performed by atomic layer deposition (ALD), chemical vapor deposition (CVD), metal organic chemical vapor deposition (MOCVD), low pressure chemical vapor deposition (LPCVD), plasma-enhanced chemical vapor deposition (PECVD) or plasma-enhanced atomic layer deposition (PEALD).

The method for manufacturing a silicon-containing thin film of the present invention may specifically include:

a) maintaining a temperature of a substrate mounted in a chamber to 30 to 400° C.;

b) injecting carrier gas and the composition for depositing a silicon-containing thin film of claim 1; and c) injecting reaction gas to deposit the silicon-containing thin film on the substrate.

The reaction gas according to an exemplary embodiment of the present invention may be any one or two or more selected from the group consisting of oxygen ($O_2$), ozone ($O_3$), distilled water ($H_2O$), hydrogen peroxide ($H_2O_2$), nitrogen monoxide (NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$ to $C_{12}$ saturated or unsaturated hydrocarbon, hydrogen, argon and helium.

Other features and aspects will be apparent from the following detailed description, the drawing, and the claims.

BRIEF DESCRIPTION OF THE DRAWINGS

FIG. 1 is a graph of vapor pressure measurement of bis(dimethylsilyl) methyldisilylamine prepared in Example 1.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the disilylamine compound, the method for preparing the same, and the composition for depositing a silicon-containing thin film including the same of the present invention will be described in detail.

"Alkyl" described herein refers to linear, branched and cyclic, saturated and unsaturated hydrocarbon, having 1 to 7, preferably 1 to 5, more preferably 1 to 3 carbon atoms, and for example, includes methyl, ethyl, propyl, isopropyl, butyl, isobutyl, pentyl, and the like.

"Halogen" described herein refers to a halogen group element, and includes for example, fluoro, chloro, bromo and iodo.

The term "alkenyl" described herein alone or as a part of another group refers to a straight chain, branched chain or cyclic hydrocarbon radical having 2 to 7 carbon atoms and one or more carbon atoms to a carbon double bond. A more preferred alkenyl radical is a lower alkenyl radical having 2 to 5 carbon atoms. The most preferred lower alkenyl radical is a radical having 2 to about 3 carbon atoms. In addition, the alkenyl group may be substituted at any usable attachment point. An example of the alkenyl radical includes ethenyl, propenyl, allyl, butenyl and 4-methylbutenyl. The terms alkenyl and lower alkenyl include radicals being cis- and trans-oriented, or alternatively having E and Z orientations.

The present invention provides a composition for depositing a silicon-containing thin film including a disilylamine compound represented by the following Chemical Formula 1 which has excellent reactivity and thermal stability, and at the same time, is mostly present as a liquid at room temperature, thereby being easy to handle, as a precursor for depositing a thin film:

[Chemical Formula 1]

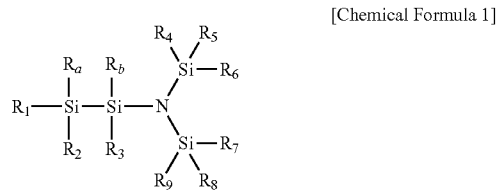

wherein $R_a$, $R_b$ and $R_1$ to $R_9$ are each independently hydrogen, (C1-C7)alkyl or (C2-C7)alkenyl, with a proviso that $R_a$ and $R_b$ are not hydrogen at the same time.

The disilylamine compound included in the composition for depositing a silicon-containing thin film of the present invention has an unshared pair of electrons of nitrogen atom additionally provided to a silicon atom in the molecule so that the binding energy of silicon and nitrogen atoms is increased, and has low activation energy with a trigonal planar $Si_3N$ molecular structure form in which three silicon atoms are bonded to a nitrogen atom, thereby having excellent reactivity and excellent thermal stability, and thus, being very useful as a precursor of a silicon-containing thin film.

In addition, the disilylamine compound of the present invention which is a compound mostly in a liquid form at room temperature under normal pressure has excellent volatility and a high content of a silicon atom in the molecule, and thus, the composition for depositing a silicon-containing thin film including the compound may manufacture a high-quality silicon-containing thin film at a high deposition rate.

Preferably, in Chemical Formula 1 of the present invention, $R_a$ and $R_b$ may be each independently hydrogen, (C1-C5)alkyl or (C2-C5)alkenyl, with a proviso that $R_a$ and $R_b$ are not hydrogen at the same time; $R_1$ to $R_3$ may be hydrogen; $R_4$ to $R_9$ may be each independently hydrogen, (C1-C5)alkyl or (C2-C5)alkenyl, and more preferably $R_a$ and $R_b$ may be each independently hydrogen or (C2-C5)alkenyl, with a proviso that $R_a$ and $R_b$ are not hydrogen at the same time; $R_1$ to $R_3$ may be hydrogen; $R_4$ to $R_9$ may be each independently hydrogen, (C1-C5)alkyl or (C2-C5)alkenyl.

More preferably, Chemical Formula 1 of the present invention may be represented by the following Chemical Formula 2:

[Chemical Formula 2]

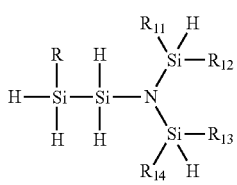

wherein R is (C1-C7)alkyl; and $R_{11}$ to $R_{14}$ are each independently hydrogen, (C1-C7)alkyl or (C2-C7)alkenyl.

The disilylamine compound represented by the above Chemical Formula 2 which is a silicon precursor included in the composition for depositing a silicon-containing thin film of the present invention has an unshared pair of electrons of nitrogen atom additionally provided to a silicon atom in the molecule so that binding energy of silicon and nitrogen atoms is increased, has a trigonal planar $Si_3N$ molecular structure form in which three silicon atoms are bonded to a nitrogen atom, and also has a Sit molecular structure form which is electronically sensitive by having two silicon atoms including three hydrogens having cationic properties

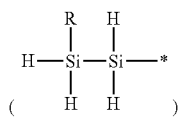

bonded thereto, thereby lower activation energy to have better reactivity, and thus, silicon-containing thin film may be easily deposited at a high deposition rate.

Besides, thermal stability is excellent, and thus, a thin film having high durability and excellent purity may be manufactured.

In terms of manufacturing a better silicon-containing thin film, more preferably in Chemical Formula 2, $R_{11}$ to $R_{14}$ may be each independently hydrogen or (C1-C5)alkyl, more preferably R is (C1-C3)alkyl, and $R_{11}$ to $R_{14}$ may be each independently hydrogen, (C1-C3)alkyl or (C2-C3)alkenyl.

Chemical Formula 2 according to an exemplary embodiment of the present invention may be represented by the following Chemical Formula 2-1 or 2-2:

[Chemical Formula 2-1]

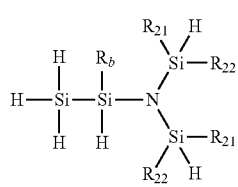

[Chemical Formula 2-2]

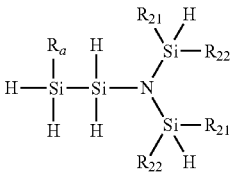

wherein $R_a$ and $R_b$ are each independently (C1-C7)alkyl; and $R_{21}$ and $R_{21}$ are each independently hydrogen, (C1-C7)alkyl or (C2-C7)alkenyl.

Specifically, the disilylamine compound of Chemical Formula 1 of the present invention may be selected from the following compounds, but not limited thereto:

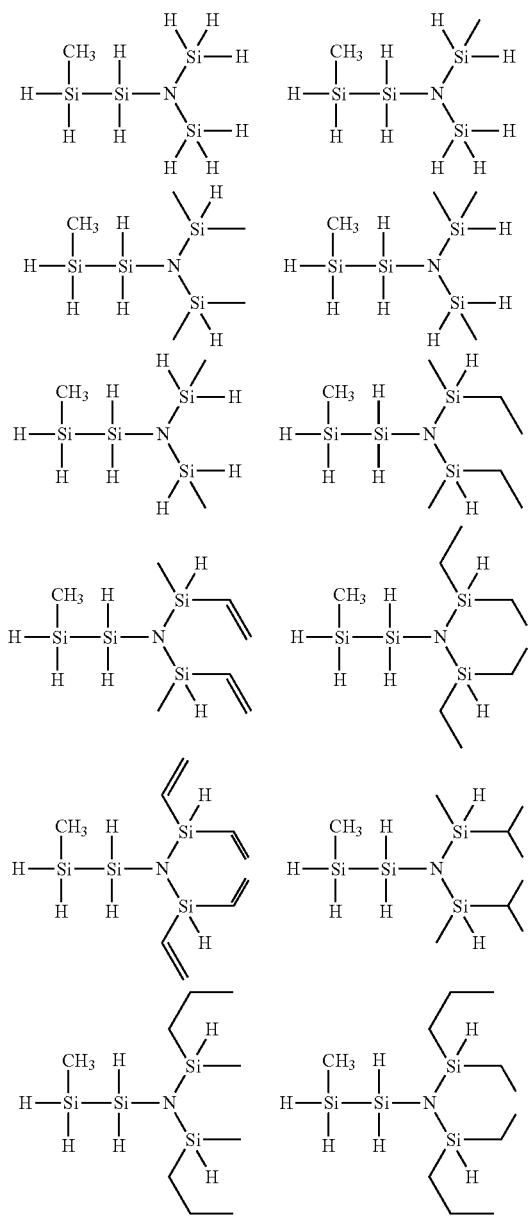

-continued

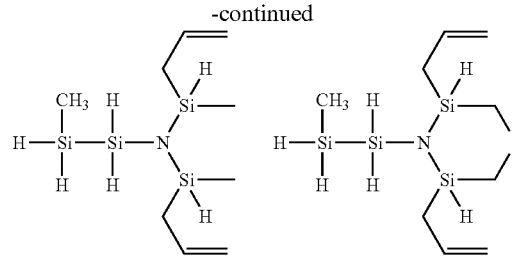
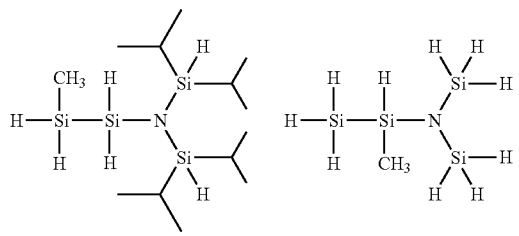
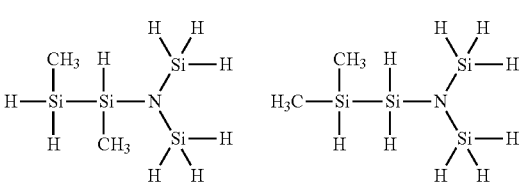
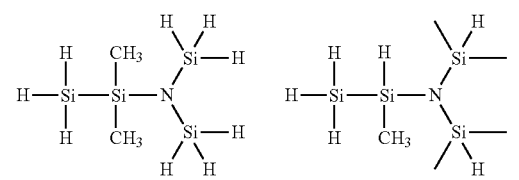
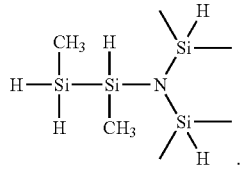

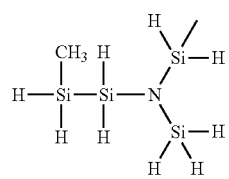
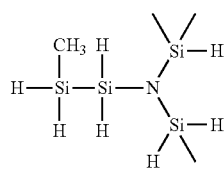
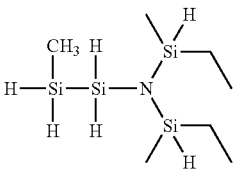
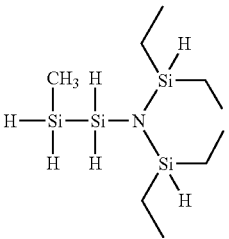
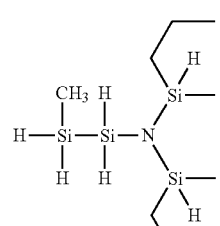
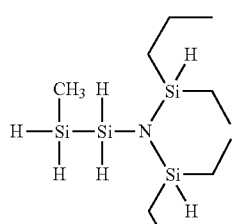
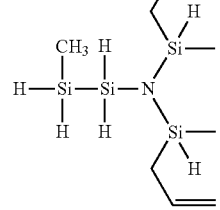
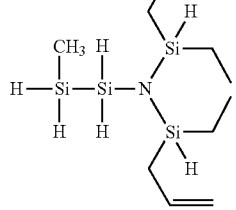

Further, the present invention provides a compound of the above Chemical Formula 1 included in the composition for depositing a silicon-containing thin film of the present invention.

Preferably, in Chemical Formula 1 of the present invention, $R_a$ and $R_b$ may be each independently hydrogen or (C1-C5)alkyl or (C2-C5)alkenyl, with a proviso that $R_a$ and $R_b$ are not hydrogen at the same time; $R_1$ to $R_3$ may be hydrogen; $R_4$ to $R_9$ may be each independently hydrogen, (C1-C5)alkyl or (C2-C5)alkenyl, and more preferably $R_a$ and $R_b$ may be each independently hydrogen or (C1-C5) alkyl, with a proviso that $R_a$ and $R_b$ are not hydrogen at the same time; $R_1$ to $R_3$ may be hydrogen; $R_4$ to $R_9$ may be each independently hydrogen, (C1-C5)alkyl or (C2-C5)alkenyl.

Preferably, in Chemical Formula 2 according to an exemplary embodiment of the present invention, $R_{11}$ to $R_{14}$ may be each independently hydrogen or (C1-C5)alkyl.

The disilylamine compound of Chemical Formula 1 according to an exemplary embodiment of the present invention may be selected from the following structures, but not limited thereto:

-continued

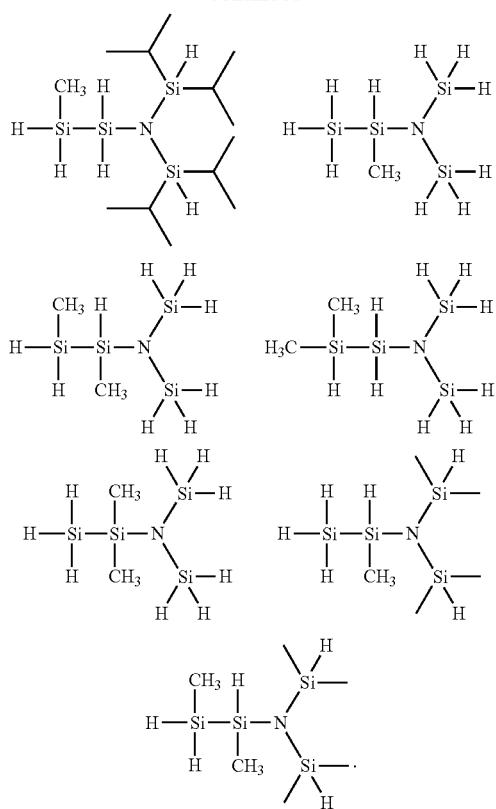

Further, as a method for manufacturing the compound of Chemical Formula 1 according to an exemplary embodiment of the present invention, any method is possible as long as it is within the cognizance of a person skilled in the art, however, as a specific example, the method includes:

reacting a compound of the following Chemical Formula 3 and a compound of the following Chemical Formula 4 in the presence of a base to prepare a compound of Chemical Formula 5; and reducing the compound of the following Chemical Formula 5 in the presence of a reducing agent to prepare the disilylamine compound of the following Chemical Formula 1, thereby capable of manufacturing the disilylamine compound of the following Chemical Formula 1:

[Chemical Formula 1]

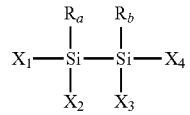

[Chemical Formula 3]

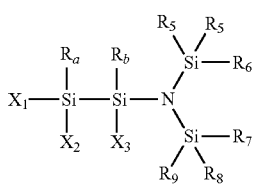

[Chemical Formula 4]

$$X_1-\underset{\underset{X_2}{|}}{\overset{\overset{R_a}{|}}{Si}}-\underset{\underset{X_3}{|}}{\overset{\overset{R_b}{|}}{Si}}-X_4$$

[Chemical Formula 5]

$$X_1-\underset{\underset{X_2}{|}}{\overset{\overset{R_a}{|}}{Si}}-\underset{\underset{X_3}{|}}{\overset{\overset{R_b}{|}}{Si}}-N\underset{\underset{R_9}{\diagdown}\overset{}{R_8}}{\overset{\overset{R_5}{\diagup}\overset{R_5}{\diagdown}}{\diagup}}\begin{matrix}Si-R_6\\ \\ Si-R_7\end{matrix}$$

wherein $R_a$, $R_b$ and $R_1$ to $R_9$ are each independently hydrogen, (C1-C7)alkyl or (C2-C7)alkenyl, with a proviso that $R_a$ and $R_b$ are not hydrogen at the same time; and $X_1$ to $X_4$ are each independently halogen.

As the base according to an exemplary embodiment of the method for preparing a disilylamine compound of the present invention, any base is possible as long as it is within the cognizance of a person skilled in the art to which the present invention pertains, however, the base may be preferably tri(C1-C5)alkylamine or pyridine, and specifically trimethylamine, triethylamine, pyridine and the like, and a mole ratio of the base and the compound of Chemical Formula 4 may be in a range of 1:1 to 1:2, 1:1 to 1:1.5 for rapidly completing the reaction, and more preferably 1:1.25.

The reducing agent according to an exemplary embodiment of the method for preparing a disilylamine compound of the present invention is not limited, but may be preferably $LiAlH_4$, $NaBH_4$ or MH (wherein M is an alkali metal), and the alkali metal may be Li, Na or K.

The reducing agent of the present invention may be used at a mole ratio with the compound of Chemical Formula 5 of 1:1.25 to 1:6, preferably 1:1.25 to 1:5.5, and the compound of Chemical Formula 3 may be used at a ratio of 1 to 2 mole relative to 1 mole of the compound of Chemical Formula 2.

As the solvent used in the preparation method of the present invention, any base is possible as long as it is a common organic solvent, however, it is preferred to use one or more selected from the group consisting of hexane, pentane, dichloromethane (DCM), dichloroethane (DCE), toluene, acetonitrile (MeCN), nitromethane, tetrahydrofuran (THF), N,N-dimethyl formamide (DMF), tetraethyleneglycol dimethylethane and N,N-dimethylacetamide (DMA), polyether (diglyme, triglyme and/or tetraglyme).

A reaction temperature may be the temperature used in a common organic synthesis, but vary depending on reaction materials and an amount of a starting material, and the reaction is completed after confirming by NMR and the like that the starting material is completely consumed. When the reaction is completed, the solvent is distilled under reduced pressure after an extraction process, and then a desired material may be separated and purified by a typical method such as column chromatography.

Further, the present invention provides a composition for depositing a silicon-containing thin film including the disilylamine compound of the present invention.

The composition for depositing a silicon-containing thin film of the present invention should necessarily include the disilylamine compound represented by Chemical Formula 1 as a precursor, but may include one or more disilylamine compound, and the content of the disilylamine compound in the composition for depositing a silicon-containing thin film may be within the cognizance of a person skilled in the art, considering the film formation conditions, or the thickness, properties, or the like of the thin film.

Further, the present invention provides a method for manufacturing a silicon-containing thin film using the composition for depositing a silicon-containing thin film of the present invention.

The method for manufacturing a silicon-containing thin film according to an exemplary embodiment of the present invention manufactures a thin film, using the composition for depositing a silicon-containing thin film of the present invention, including the disilylamine compound represented by the above Chemical Formula 1 which is liquid at room temperature, and has high volatility and excellent thermal stability, as a precursor, thereby capable of manufacturing various thin films which are easy to handle as a precursor, and manufacturing a high-purity thin film having a high silicon content to have a high deposition rate and an excellent step coverage.

As the method for manufacturing a silicon-containing thin film of the present invention, any method is possible as long as it is within the cognizance of a person skilled in the art, however, it may be performed preferably by atomic layer deposition (ALD), chemical vapor deposition (CVD), metal organic chemical vapor deposition (MOCVD), low pressure chemical vapor deposition (LPCVD), plasma-enhanced chemical vapor deposition (PECVD) or plasma-enhanced atomic layer deposition (PEALD), more preferably plasma-enhanced atomic layer deposition (PEALD) or plasma-enhanced chemical vapor deposition (PECVD).

The method for manufacturing a silicon-containing thin film of the present invention may specifically include:

a) maintaining a temperature of a substrate mounted in a chamber to 30 to 400° C.;

b) injecting carrier gas and the composition for depositing a silicon-containing thin film according to an exemplary embodiment of the present invention; and c) injecting reaction gas to deposit the silicon-containing thin film on the substrate.

Preferably, when depositing the silicon-containing thin film according to an exemplary embodiment of the present invention by plasma-enhanced atomic layer deposition (PEALD) or plasma-enhanced chemical vapor deposition (PECVD), a step of generating plasma may be further included after step a), and the composition for depositing a silicon-containing thin film of step b) may be injected together with the carrier gas.

In the method for manufacturing a silicon-containing thin film according to an exemplary embodiment of the present invention, deposition conditions may be adjusted depending on the structure or thermal properties of the desired thin film. As the deposition conditions according to an exemplary embodiment of the present invention, an input flow rate of the composition for depositing a silicon-containing thin film containing a disilylamine compound, input flow rate of reaction gas and carrier gas, pressure, RF power, a substrate temperature and the like may be exemplified, and as a non-limited example of the deposition condition, the conditions may be adjusted as follows: an input flow rate of the composition for depositing a silicon-containing thin film of 10 to 1000 cc/min, a flow rate of carrier gas of 10 to 1000 cc/min, a flow rate of reaction gas of 1 to 1000 cc/min, pressure of 0.5 to 10 torr, RF power of 200 to 1000 W, and a substrate temperature of 30 to 400° C., but not limited thereto.

The method for manufacturing a thin film of the present invention may use the composition for depositing a silicon-containing thin film including the disilylamine compound according to an exemplary embodiment of the present invention as the precursor, thereby forming a thin film at a low substrate temperature of 30 to 200° C., or even at a lower temperature of 30 to 100° C., which is very economical, and is very advantageous for commercial application.

The reaction gas used in the method for manufacturing a silicon-containing thin film of the present invention is not limited, however, may be one or two or more selected from the group consisting of oxygen ($O_2$), ozone ($O_3$), distilled water ($H_2O$), hydrogen peroxide ($H_2O_2$), nitrogen monoxide NO), nitrous oxide ($N_2O$), nitrogen dioxide ($NO_2$), ammonia ($NH_3$), nitrogen ($N_2$), hydrazine ($N_2H_4$), amine, diamine, carbon monoxide (CO), carbon dioxide ($CO_2$), $C_1$ to $C_{12}$ saturated or unsaturated hydrocarbon, hydrogen, argon and helium, and the carrier gas may be one or two or more selected from argon, helium and nitrogen.

The substrate used in the method for manufacturing a silicon-containing thin film according to an exemplary embodiment of the present invention may be a substrate including one or more semiconductor materials among Si, Ge, SiGe, GaP, GaAs, SiC, SiGeC, InAs and InP; a flexible plastic substrate such as a SOI (silicon on insulator) substrate; a quartz substrate; or a glass substrate for display; polyimide, polyethylene terephthalate (PET), polyethylene naphthalate (PEN), polymethyl methacrylate (PMMA), polycarbonate (PC), polyethersulfone (PES) and polyester; but not limited thereto.

The silicon-containing thin film may be formed directly on the substrate, but in addition, a plurality of conductive layers, dielectric layers, insulating layers, or the like may be formed between the substrate and the silicon-containing thin film.

Hereinafter, the present invention will be described in detail by the following Examples. Prior to this, terms and words used in the present specification and claims are not to be construed as a general or dictionary meaning but are to be construed meaning and concepts meeting the technical ideas of the present invention based on a principle that the inventors can appropriately define the concepts of terms in order to describe their own inventions in best mode.

Therefore, the configurations illustrated in the Examples and drawings described herein are merely the most preferred exemplary embodiment of the present invention but do not represent all of the technical spirit of the present invention. Thus, it should be understood that there are various equivalents and modified examples to replace these at the time of filing the present application.

In addition, the following Examples were all carried out by the known plasma-enhanced atomic layer deposition (PEALD) using 200 mm single wafer type ALD equipment (CN1, Atomic Premium) in a shower head mode. In addition, it may be carried out by the known plasma-enhanced chemical vapor deposition (PECVD) using 200 mm single wafer type CVD equipment (CN1, Atomic Premium) in a shower head mode.

The thickness of the deposited silicon-containing thin film was measured by an ellipsometer (M2000D, Woollam), and a transmission electron microscope, and the composition thereof was analyzed using an infrared spectroscopy (IFS66V/S & Hyperion 3000, Bruker Optiks), X-ray photoelectron spectroscopy and a secondary ion mass spectrometer (SIMS).

[Example 1] Preparation of bis(dimethylsilyl)methyldisilylamine

Step 1: Preparation of bis(dimethylsilyl)tetrachlorodisilylamine

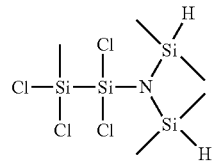

To a 5 L SUS reactor dried under anhydrous atmosphere and inert atmosphere, 2000 g (8.05 mol) of methylpentachlorodisilane ($Si_2Cl_5CH_3$) and 1500 mL of an organic solvent, normal pentane were added, and 752.7 g (8.05 mol) of triethylamine (($CH_3CH_2$)$_3$N) was slowly added with stirring, while maintaining the temperature at −20° C. After completing addition, 1073 g (8.05 mol) of tetramethyl disilazne ((($CH_3$)$_2$SiH)$_2$NH) was slowly added again while maintaining the temperature at −20° C. The reaction solution after completing addition was slowly heated to room temperature, and stirred for 6 hours while maintaining the temperature at 25° C. White solid produced after filtering the reaction mixture which completed the reaction was removed to obtain a filtrate, from which the solvent was removed under reduced pressure, thereby obtaining 2501 g (7.24 mol) of bis(dimethylsilyl) tetrachloromethyldisilylamine ((($CH_3$)$_2$SiH)$_2$NSi(Cl)$_2$SiCl$_2$CH$_3$) in a yield of 90%.

$^1$H NMR (in $CDCl_3$): δ0.14 (d, 12H, ((($CH_3$)$_2$SiH)$_2$NSi(Cl)$_2$SiCl$_2$CH$_3$), δ4.60 (m, 2H, ((($CH_3$)$_2$SiH)$_2$NSi(Cl)$_2$SiCl$_2$CH$_3$), δ0.19 (s, 3H ((($CH_3$)$_2$SiH)$_2$NSi(Cl)$_2$SiCl$_2$CH$_3$)

Step 2: Preparation of bis(dimethylsilyl)methyldisilylamine

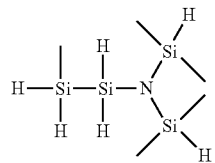

To a 20 L SUS reactor dried under anhydrous atmosphere and inert atmosphere, 2000 ml of the organic solvent, tetraethyleneglycol dimethylether (TEGDME) was added, and 379 g (9.99 mol) of lithium aluminum hydride ($LiAlH_4$) was slowly added with stirring while maintaining the temperature at −10° C. After completing addition, 2501 g (7.24 mol) of bis(dimethylsilyl) tetrachloromethyldisilylamine (((($CH_3$)$_2$SiH)$_2$NSi(Cl)$_2$SiCl$_2$CH$_3$) was slowly added thereto while maintaining the temperature at −10° C. The reaction solution after completing addition was stirred for 20 hours while maintaining the temperature at −10° C. White solid produced after filtering the reaction mixture which completed the reaction was removed to obtain a filtrate, from which the solvent was removed under reduced pressure, and vacuum distillation was performed to obtain 752 g (3.62 mol) of bis(dimethylsilyl)methyldisilylamine ((($CH_3$)$_2$SiH)$_2$ NSi(H)$_2$SiH$_2$CH$_3$) in a yield of 50%.

$^1$H NMR (in $CDCl_3$): δ0.14 (d, 12H, ((($CH_3$)$_2$SiH)$_2$NSi(H)$_2$SiH$_2$CH$_3$), δ4.76 (m, 2H, ((($CH_3$)$_2$Si$\underline{H}$)$_2$NSi(H)$_2$SiH$_2$CH$_3$), δ4.60 (m, 2H ((($CH_3$)$_2$SiH)$_2$NSi($\underline{H}$)$_2$SiH$_2$CH$_3$), δ3.80 (m, 2H ((($CH_3$)$_2$SiH)$_2$NSi(H)$_2$Si$\underline{H}_2$CH$_3$), δ0.26 (m, 3H ((($CH_3$)$_2$SiH)$_2$NSi(H)$_2$SiH$_2$C$\underline{H}_3$)

A graph of vapor pressure measurement of bis(dimethylsilyl)methyldisilylamine prepared in Example 1 is shown in FIG. 1. It may be recognized from FIG. 1 that the thin film is easily deposited with the use of the composition for depositing a silicon-containing thin film including the disilylamine compound of the present invention.

The composition for depositing a silicon-containing thin film of the present invention includes a disilylamine compound having low activation energy to have excellent reactivity, excellent thermal stability and high volatility, as a precursor for depositing a silicon-containing thin film, thereby capable of manufacturing a thin film having excellent physical and electrical properties such as a high deposition rate and an excellent step coverage, and excellent purity and durability.

Furthermore, the disilylamine compound included in the composition for depositing a silicon-containing thin film of the present invention is present in a liquid state at room temperature or under pressure capable of handling, thereby being easy to handle, and thus, it is easier to manufacture the silicon-containing thin film.

In addition, according to the method for manufacturing a silicon-containing thin film of the present invention, it is possible to manufacture a silicon-containing thin film, using a composition for depositing a silicon-containing thin film including a disilylamine compound having high thermal stability and excellent reactivity, thereby allowing manufacture of a silicon-containing thin film with durability and high quality, having a high silicon content and excellent thermal stability.

The invention claimed is:

1. A composition for depositing a silicon-containing thin film, comprising a disilylamine compound represented by the following Chemical Formula 1:

[Chemical Formula 1]

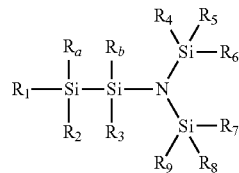

wherein $R_a$, $R_b$ and $R_1$ to $R_9$ are each independently hydrogen, C1-C7alkyl or C2-C7alkenyl, with a proviso that $R_a$ and $R_b$ are not hydrogen at the same time.

2. The composition for depositing a silicon-containing thin film of claim 1, wherein in Chemical Formula 1, $R_a$ and $R_b$ are each independently hydrogen, C1-C5alkyl or C2-C5alkenyl, with a proviso that $R_a$ and $R_b$ are not hydrogen at the same time;

$R_1$ to $R_3$ are hydrogen; and $R_4$ to $R_9$ are each independently hydrogen, C1-C5alkyl or C2-C5alkenyl.

3. The composition for depositing a silicon-containing thin film of claim 1, wherein Chemical Formula 1 is represented by the following Chemical Formula 2:

[Chemical Formula 2]

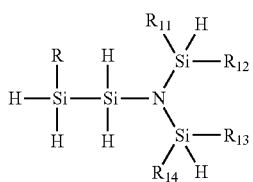

wherein R is C1-C7alkyl; and $R_{11}$ to $R_{14}$ are each independently hydrogen, C1-C7alkyl or C2-C7alkenyl.

4. The composition for depositing a silicon-containing thin film of claim 3, wherein in Chemical Formula 2, $R_{11}$ to $R_{14}$ are each independently hydrogen or C1-C5alkyl.

5. The composition for depositing a silicon-containing thin film of claim 1, wherein the disilylamine compound of Chemical Formula 1 is selected from the group consisting of the following compounds:

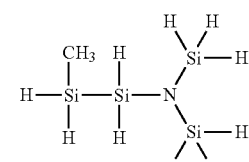
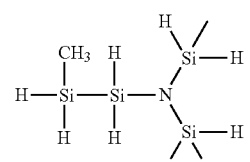
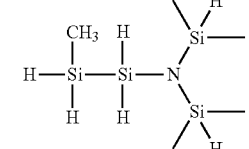
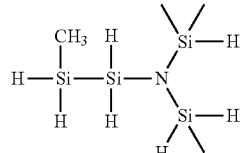
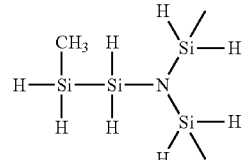
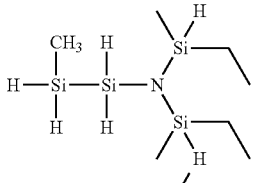
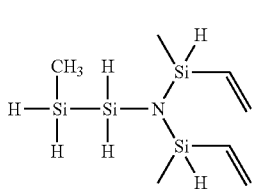
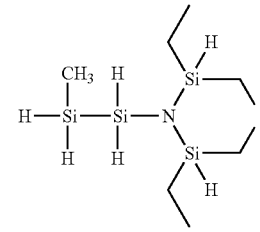
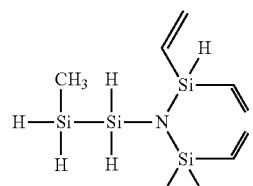
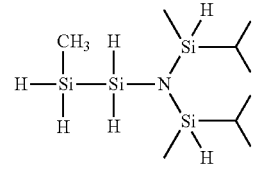
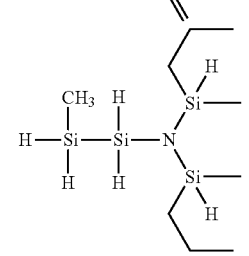
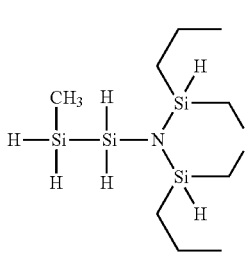

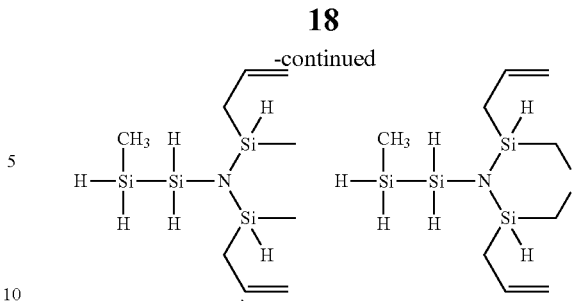
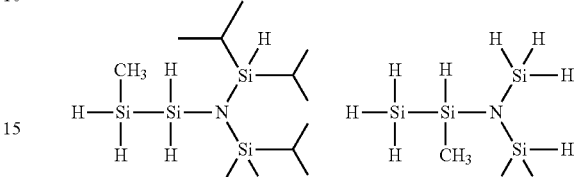
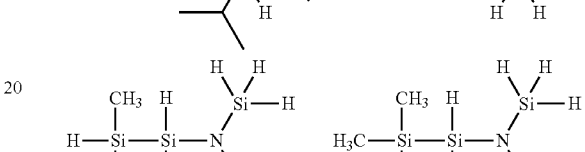
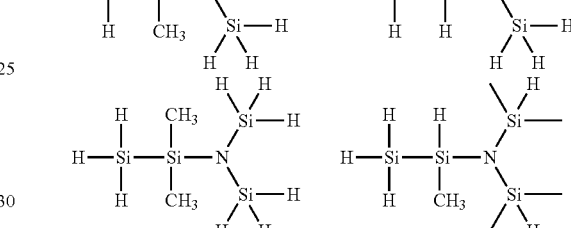
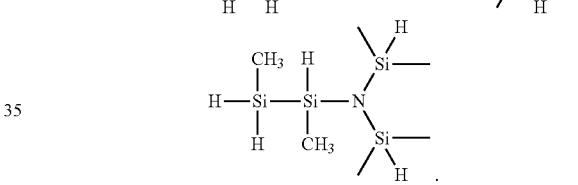
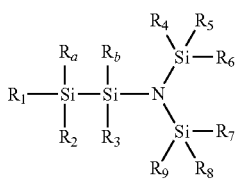

6. A method for manufacturing a silicon-containing thin film, using a composition for depositing a silicon-containing thin film, comprising a disilylamine compound represented by the following Chemical Formula 1:

[Chemical Formula 1]

wherein
$R_a$, $R_b$ and $R_1$ to $R_9$ are each independently hydrogen, C1-C7alkyl or C2-C7alkenyl, with a proviso that $R_a$ and $R_b$ are not hydrogen at the same time.

7. The method of claim 6, wherein the method is performed by atomic layer deposition, chemical vapor deposition, metalorganic chemical vapor deposition, low pressure chemical vapor deposition, plasma-enhanced chemical vapor deposition or plasma-enhanced atomic layer deposition.

8. The method of claim 6, comprising:
a) maintaining a temperature of a substrate mounted in a chamber to 30 to 400° C.;

b) injecting carrier gas and the composition for depositing a silicon-containing thin film of claim 1; and c) injecting reaction gas to deposit the silicon-containing thin film on the substrate.

9. The method of claim 8, wherein the reaction gas is any one or two or more selected from the group consisting of oxygen, ozone, distilled water, hydrogen peroxide, nitrogen monoxide, nitrous oxide, nitrogen dioxide, ammonia, nitrogen, hydrazine, amine, diamine, carbon monoxide, carbon dioxide, $C_1$ to $C_{12}$ saturated or unsaturated hydrocarbon, hydrogen, argon and helium.

10. The method of claim 6, wherein in Chemical Formula 1,

Ra and Rb are each independently hydrogen, C1-C5alkyl or C2-C5alkenyl, with a proviso that Ra and Rb are not hydrogen at the same time;

R1 to R3 are hydrogen; and

R4 to R9 are each independently hydrogen, C1-C5alkyl or C2-C5alkenyl.

11. The method of claim 6, wherein Chemical Formula 1 is represented by the following Chemical Formula 2:

[Chemical Formula 2]

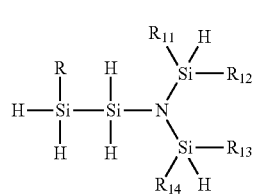

wherein R is C1-C7alkyl; and R11 to R14 are each independently hydrogen, C1-C7alkyl or C2-C7alkenyl.

12. The method of claim 11, wherein in Chemical Formula 2, R11 to R14 are each independently hydrogen or C1-C5alkyl.

13. The method of claim 6, wherein the disilylamine compound of Chemical Formula 1 is selected from the group consisting of the following compounds:

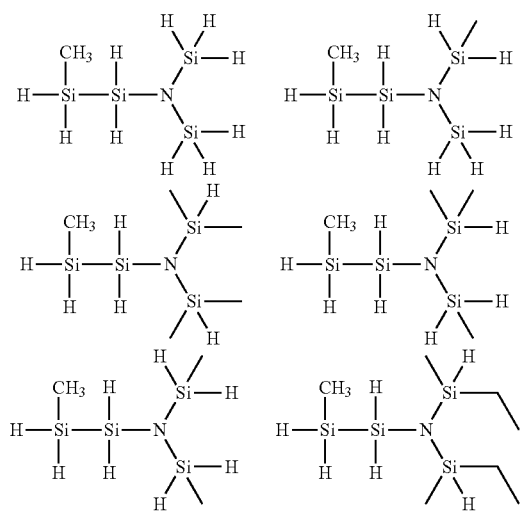

-continued

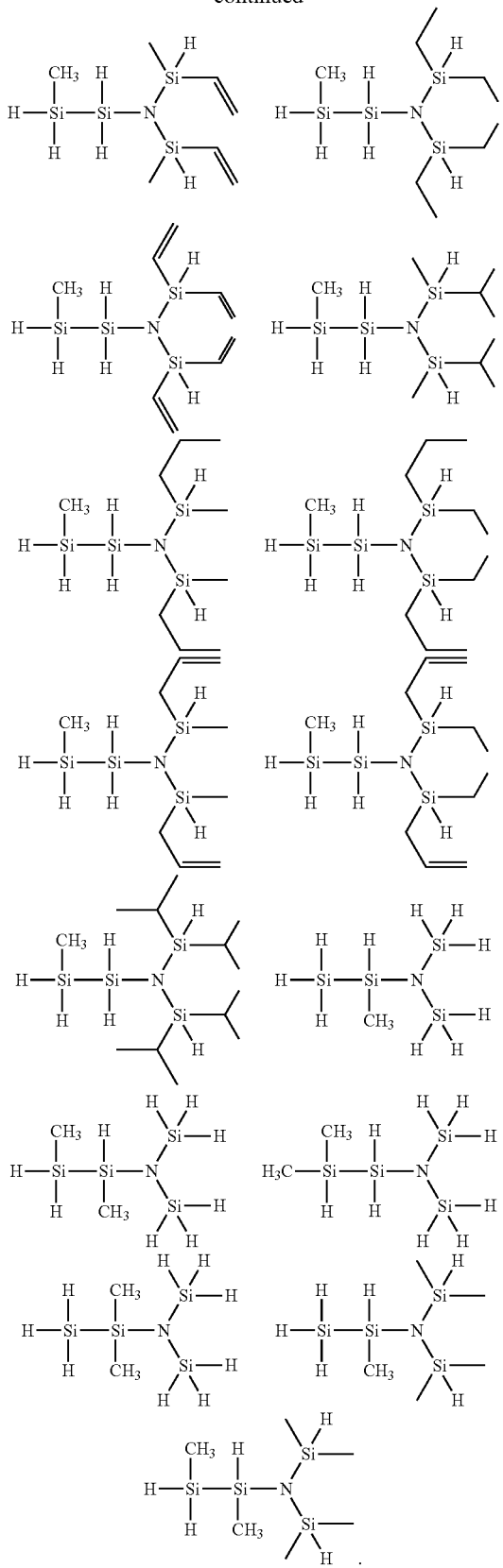

* * * * *